(12) United States Patent
Gregoire

(10) Patent No.: US 7,263,136 B2
(45) Date of Patent: Aug. 28, 2007

(54) PREDISTORTION MODULATOR

(75) Inventor: Daniel J. Gregoire, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 834 days.

(21) Appl. No.: 10/620,792

(22) Filed: Jul. 14, 2003

(65) Prior Publication Data

US 2005/0013384 A1 Jan. 20, 2005

(51) Int. Cl.
*H04L 25/49* (2006.01)
*H03K 7/00* (2006.01)
*H03C 3/00* (2006.01)

(52) U.S. Cl. .................. 375/296; 332/107; 332/117

(58) Field of Classification Search ............... 332/123, 332/124, 125, 117, 103, 106, 107; 375/295–297, 375/261, 279, 280, 298, 308
See application file for complete search history.

(56) References Cited

U.S. PATENT DOCUMENTS

| | | | | |
|---|---|---|---|---|
| 5,699,383 A | * | 12/1997 | Ichiyoshi | 375/297 |
| 5,903,823 A | * | 5/1999 | Moriyama et al. | 455/126 |
| 6,266,517 B1 | * | 7/2001 | Fitzpatrick et al. | 455/114.3 |
| 6,304,140 B1 | * | 10/2001 | Thron et al. | 330/149 |
| 6,798,843 B1 | * | 9/2004 | Wright et al. | 375/296 |
| 6,907,085 B2 | * | 6/2005 | Kubo et al. | 375/285 |
| 6,973,141 B1 | * | 12/2005 | Isaksen et al. | 375/308 |
| 6,993,090 B2 | * | 1/2006 | Kusunoki | 375/296 |

OTHER PUBLICATIONS

P.B. Kenington et al., " A GSM-EDGE High Power Amplifier utilising Digital Linearisation" 0-7803-6540-2/01/$10.00 (C) 2001 IEEE, Wireless Systems International Ltd, Bristol, BS16 1EJ, UK.
Allen Katz, "Multi-Carrier 16QAM Over A Linearized TWTA", 0-7803-6540-2/01/$10.00 (C) 2001 IEEE, The College of New Jersey.
"SM5600 Satellite Modulator" technical specification sheets, © 2000, Tandberg Television Inc., USA.

* cited by examiner

*Primary Examiner*—Tesfaldet Bocure
(74) *Attorney, Agent, or Firm*—Ingrassia Fisher & Lorenz, P.C.

(57) ABSTRACT

A device for predistorting a digital symbol for modulating an RF signal includes a multi-bit buffer connected to an input serial bit stream and providing a parallel bit stream from the input serial bit stream; and a processing module connected to the input parallel bit stream. The processing module converts data bits of the input parallel bit stream into an input digital symbol and inputs a set of gain adjustments and phase adjustments that compensate for a channel distortion. The processing module decides which of the set of gain and phase adjustments to apply depending on a magnitude of the input digital symbol, applies a gain adjustment and a phase adjustment, from the set of gain and phase adjustments, to the input digital symbol to produce a predistorted symbol, and outputs quadrature components of the predistorted symbol to a quadrature modulator.

28 Claims, 3 Drawing Sheets

PREDISTORTION MODULATOR

BACKGROUND OF THE INVENTION

The present invention generally relates to digital communication over radio frequency (RF) channels and, more particularly, to providing bandwidth efficient modulation of RF signals for digital communications through satellite transponders.

At present, commercial satellite transmission equipment for digital communications is generally limited to quadrature phase shift keying (QPSK) or eight phase shift keying (8-PSK) modulation that limits data rates to approximately 30 to 45 megabits per second (Mbps) on a standard satellite transponder channel. For commercial users wishing to transfer large data files, it can take approximately eight hours for transmission, for example, of a sixty giga-byte data file at data rates between 30 Mbps and 45 Mbps. The use of a satellite transponder channel for such a length of time can represent a significant amount of expense for such a commercial user. Thus, any reduction in transmission time that can be achieved through more efficient use of the satellite transponder communication channel can provide significant cost savings, and advantages of speed and increased channel capacity. The same considerations may be applied not only to the transfer of large data files but, more generally, to increased bandwidth efficiency for all types of satellite communications, including telecommunications.

The prior art for digital file transmission over satellite transponder communication channels is overwhelmingly dominated by commercial QPSK modulators and receivers because their constant-envelope modulation is not adversely affected by the nonlinear distortion introduced at the satellite transponder. Typically, nonlinear distortion dictates that satellite communication applications use the lower-order constant-envelope modulation types such as QPSK and 8PSK. This is because the need for satellite power efficiency requires operating transponders near saturation where the input/output curve is flattened out so that the amplitude variations going into the amplifier are not being represented properly at the output, i.e., amplitude is distorted. Thus, amplitude distortions can prevent the use of higher order modulation types, such as quadrature amplitude modulation (QAM) that depend on non-distorted amplitude transmission. Traveling-wave tubes (TWTs) are still used for much of the satellite communications application, especially in geosynchronous communications satellites. TWTs typically demonstrate nonlinear distortion that is amplitude dependent and memoryless.

Amplifier nonlinearity is present, as well, in other types of communications systems. Cell phone networks, for example, in which a mobile station (the cell phone) communicates with a base station using RF signals, may be subject to analogous limitations and problems to those of the satellite transponder channel. Also, for example, code division multiple access (CDMA) systems are known to be sensitive to nonlinearity. If the nonlinearity could be compensated for, improvements in performance and efficiency could be expected for a number of types of communications systems, including cell phone and CDMA communications systems Predistortion is an active technology in all wireless communications applications. Typically, a predistorter is installed on the front end of a satellite transponder to reduce intermodulation products and adjacent channel interference. Predistorters are often implemented as an analog gain (amplitude) decompressor and phase shifter that compensates for the gain compression and phase shift within the power amplifier. Predistorters are typically inserted in the communications channel somewhere after the modulator and the RF upconverter, but before the power amplifier. An analog predistorter for satellite communications may be implemented on the ground, for example, by predistorting the modulated RF signal (to match the particular satellite transponder) at the ground transmitter before it is inserted into the power amplifier and then transmitted. Analog predistorters typically attempt to provide a continuous predistortion over the whole range of amplifier input power. Thus, an analog predistorter must be designed specifically to match the characteristics, for example, transfer function, of each model of each particular manufacturer's line or class of transponder amplifiers. For example, an inverted gain that compensates for the amplitude distortions of the transponder needs to be applied to the modulated signal before transmission, but it can be extremely difficult to properly match the required gain compensation across all power levels of transmission. The custom-tailored nature of differently matching each class of amplifiers can be expensive and can hamper availability.

As can be seen, there is a need for a predistortion modulator to enhance bandwidth efficiency of digitally modulated signals for communications systems, including satellite communications systems. There is also a need for a predistortion modulator for transmission of digitally modulated signals that easily may be used with a wide variety of satellite transponders and amplifier classes.

SUMMARY OF THE INVENTION

In one aspect of the present invention, a device for predistorting a digital symbol for RF transmission over a satellite transponder channel includes: a processing module connected to an input parallel bit stream. The processing module converts data bits of the input parallel bit stream into an input digital symbol; applies a gain adjustment and a phase adjustment to the input digital symbol to produce a predistorted symbol; and outputs quadrature components of the predistorted symbol.

In another aspect of the present invention, a device for predistorting a digital symbol for modulating an RF signal includes a multi-bit buffer connected to an input serial bit stream and providing a parallel bit stream from the input serial bit stream; and a processing module connected to the input parallel bit stream. The processing module converts data bits of the input parallel bit stream into an input digital symbol and inputs a set of gain adjustments and phase adjustments that compensate for a channel distortion. The processing module decides which of the set of gain and phase adjustments to apply depending on a magnitude of the input digital symbol, applies a gain adjustment and a phase adjustment, from the set of gain and phase adjustments, to the input digital symbol to produce a predistorted symbol, and outputs quadrature components of the predistorted symbol.

In still another aspect of the present invention, a system for digitally predistorting and modulating an RF signal includes: a multi-bit buffer connected to an input serial bit stream and providing a parallel bit stream from the input serial bit stream; a processing module connected to the input parallel bit stream; and a quadrature {I, Q} modulator. The processing module analyzes data bits of the input parallel bit stream and determines quadrature components ($I_o$; $Q_o$) of an input digital symbol by mapping the data bits to an input symbol of a constellation map. The processing module inputs a set of gain adjustments and phase adjustments that compensate for a channel distortion and decides which of the set of gain and phase adjustments to apply depending on a magnitude $\sqrt{(I_o^2+Q_o^2)}$ of the input digital symbol. The processing module applies a gain adjustment and a phase adjustment from the set of gain and phase adjustments to the input digital symbol to produce a predistorted symbol and outputs quadrature components ($I_p$; $Q_p$) of the predistorted symbol to the quadrature modulator. The quadrature modulator modulates an IF carrier by the quadrature components ($I_p$; $Q_p$).

In yet another aspect of the present invention, a satellite digital communications system includes a multi-bit buffer connected to an input serial bit stream and providing a parallel bit stream from the input serial bit stream and a clock that provides a clock signal to the multi-bit buffer. The multi-bit buffer is an N-bit buffer and the clock operates at 1/N of the bit rate of the input serial bit stream. The multi-bit buffer is read at the clock signal to convert the input serial bit stream to the input parallel bit stream having width N so that an input digital symbol $A_o$ of a constellation map is represented by N bits of the input serial bit stream, where the constellation map has m symbols and $N=\log_2(m)$. A processing module is connected to the input parallel bit stream. The processing module analyzes data bits of the input parallel bit stream and determines quadrature components ($I_o$; $Q_o$) of the input digital symbol $A_o$ by mapping the data bits to an input symbol of a constellation map. The processing module inputs a set of gain adjustments and phase adjustments that compensate for a channel distortion. The set of gain adjustments and phase adjustments are provided in the form of a linear transformation so that a matrix multiplication is used to transform quadrature components ($I_o$; $Q_o$) to quadrature components ($I_p$; $Q_p$) of a predistorted symbol $A_p$. The processing module decides which of the set of gain and phase adjustments to apply depending on a magnitude $\sqrt{(I_o^2+Q_o^2)}$ of the input digital symbol and applies a gain adjustment $G_n$ and a phase adjustment $\Phi_n$ from the set of gain and phase adjustments to the input digital symbol to produce a predistorted symbol. The processing module applies the gain adjustment $G_n$ and the phase adjustment $\Phi_n$ from the set of gain and phase adjustments to the input digital symbol $A_o$ to produce the predistorted symbol $A_p$ according to:

$$\sqrt{(I_p^2+Q_p^2)}=G_n\sqrt{(I_o^2+Q_o^2)};$$

$$\arctan(I_p/Q_p)=\Phi_n+\arctan(I_o/Q_o); \text{ and}$$

$$A_p=G_n(A_o)e^{j(\Phi n(Ao))}$$

Then, the processing module outputs quadrature components ($I_p$; $Q_p$) of the predistorted symbol to a modulator.

In a further aspect of the present invention, a method for digitally predistorting a digital signal includes steps of: converting data bits from a serial bit stream into an input digital symbol; analyzing the input digital symbol bits to determine the quadrature components ($I_o$; $Q_o$) of the input digital symbol; deciding which of a set of gain and phase adjustments $G_n$ and $\Phi_n$ to apply to the input digital symbol; performing a scaling and rotation transformation using gain and phase adjustments $G_n$ and $\Phi_n$ on the quadrature components ($I_o$; $Q_o$) of the input digital symbol; and providing quadrature components ($I_p$; $Q_p$) for a predistorted symbol.

These and other features, aspects and advantages of the present invention will become better understood with reference to the following drawings, description and claims.

DETAILED DESCRIPTION OF THE INVENTION

Figure 1:
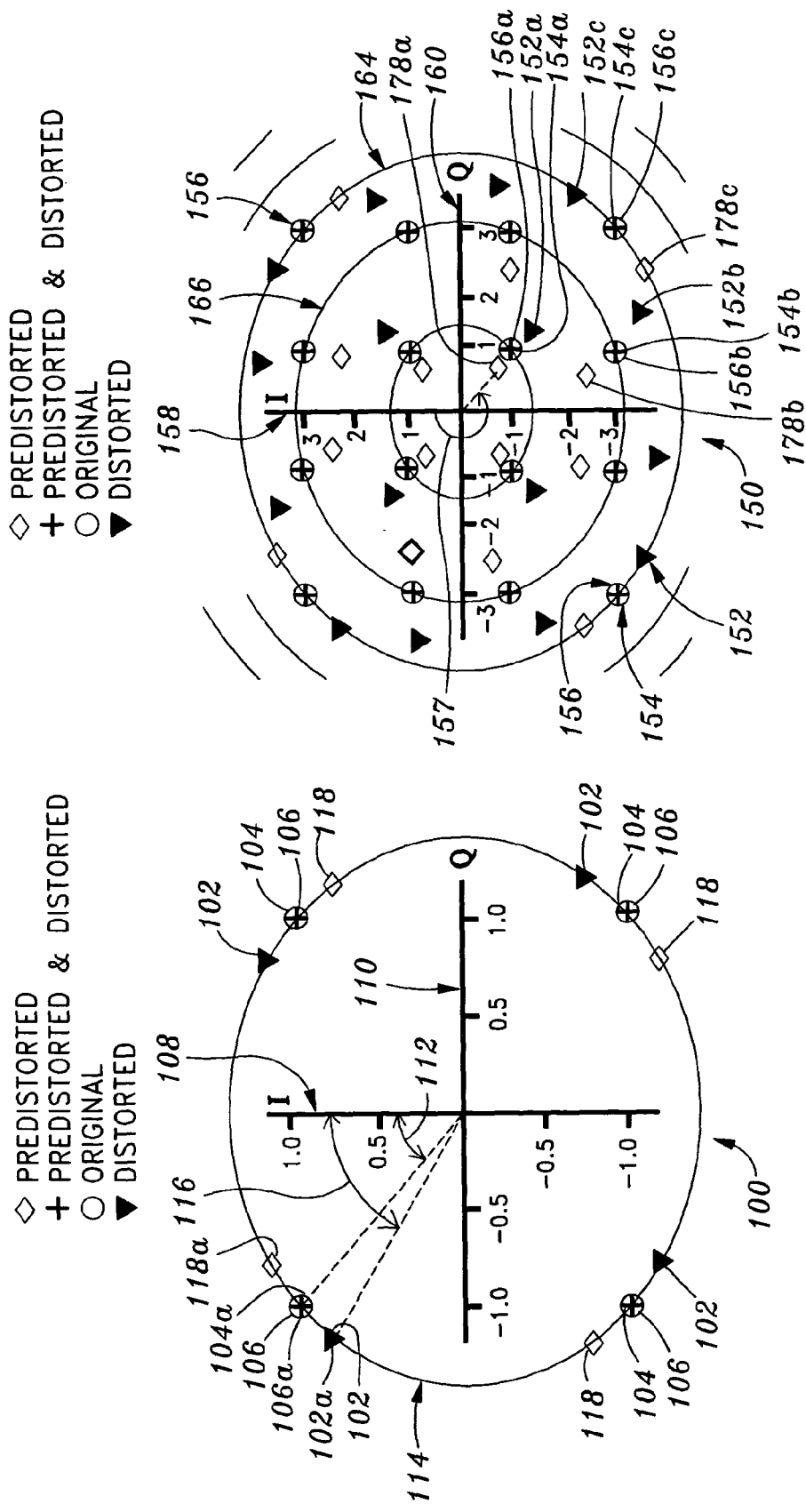
FIG. 1A is a constellation map comparing a distorted 4-QAM symbol constellation to a 4-QAM symbol constellation transmitted in accordance with an embodiment of the present invention.
FIG. 1B is a constellation map comparing a distorted 16-QAM symbol constellation to a 16-QAM symbol constellation transmitted in accordance with another embodiment of the present invention.

The following detailed description is of the best currently contemplated modes of carrying out the invention. The description is not to be taken in a limiting sense, but is made merely for the purpose of illustrating the general principles of the invention, since the scope of the invention is best defined by the appended claims.

Broadly, one embodiment of the present invention provides digital predistortion that enhances bandwidth efficiency of digitally modulated signals. The invention may be used, for example, in satellite communications generally, where improved bandwidth efficiency for digital signal transmission over satellite transponder communication channels is important for obtaining economic benefits of increased communication speed and increased channel capacity.

One embodiment of the present invention may be especially useful, for example, in the cinema industry for commercial distribution of feature films from studios to theatres in the form of digital data files. One embodiment may enable the use of higher order modulation types, such as quadrature amplitude modulation (QAM) that can make it possible to reduce the transmission time of large digital files by a factor of two or more. At prior art data rates between 30 Mbps and 45 Mbps, for example, it can take approximately eight hours for a cinema distributor to distribute a sixty-gigabyte digital feature film file from the studio network operations center (NOC) to clients at theatres. The use of a satellite transponder channel for such a length of time represents a significant amount of expense for the studio or the client, especially when multiplied by the number of films distributed. Reduction of the transmission time by a factor of two or four, for example, could decrease transmission time to about four hours or about two hours, not only providing cost-savings but making the application of satellite communications to large data file transmission more practical. Thus, the reduction in transmission time that can be achieved through more efficient use of the satellite transponder communication channel according to one embodiment of the present invention can enable new applications for satellite communications by providing significant cost savings, and advantages of speed and increased channel capacity.

An embodiment of the present invention also could be applied to other communications systems where amplifier nonlinearity is present. One example of such an application is the use of one embodiment in cell phone networks. For example, a predistortion modulator according to one embodiment could operate from within a cell phone (mobile station) predistorting the RF signal from the mobile station in order to compensate for nonlinearity in the cell base station. Unlike applications to a satellite channel where channel conditions change relatively slowly, however, application to cell phone networks would require an active adaptive loop to adjust predistortion parameters as the communication channel changes.

For example, in one embodiment, the invention is a digital m-QAM modulator (m is the order of modulation, referring to the number m of symbols available) that produces a predistorted modulated signal that is tuned to enhance the bandwidth efficiency of existing satellite communication channels. The modulator produces the predistorted modulated signal by processing the digital baseband signal prior to modulation. The processing can be implemented in hardware in a variety of ways, and in readily available circuitry. The implementation may take into account the advantage of having the predistortion work with existing satellite receivers and m-QAM demodulators.

One embodiment may provide digital predistortion of digitally modulated signals that easily may be used with a wide variety of satellite transponders and amplifier classes. In the prior art, analog devices are typically constructed which attempt to provide a continuous predistortion over the whole range of amplifier input power. These devices are typically inserted in the communications channel somewhere after the modulator and the RF upconverter and before the amplifier. Often, they are built into the transponder front-end electronics. Unlike approaches used in the prior art—such as analog predistortion which is typically applied to the already modulated intermediate frequency (IF) or radio frequency (RF) signal—one embodiment may apply digital predistortion prior to modulation of the digital baseband signal onto the IF or RF signal, taking advantage of the fact that m-QAM modulation sends symbols in a small number of amplitudes (as indicated by the "Power Levels" column shown in Table 1.) Thus, predistortion according to one embodiment needs only to make use of the distortion vectors and the corresponding predistortion vectors for that small number of amplitudes, allowing, for example, the digital predistortion to be matched to the transponder without the need for a custom design to match characteristics for each individual transponder.

TABLE 1

| M | Symbols | Bits per Symbol | Power Levels | $P_{high}/P_{low}$ dB | $P_{high}/P_{avg}$ dB |
|---|---|---|---|---|---|
| 1 | 4 | 2 | 1 | 0 | 0 |
| 2 | 16 | 4 | 3 | 9.5 | 2.55 |
| 3 | 64 | 6 | 9 | 16.9 | 3.68 |
| 4 | 256 | 8 | 32 | 23.5 | 4.23 |
| 5 | 1024 | 10 | 125 | 29.8 | 4.50 |

For example, a small number of input controls may be provided for the user to adjust the transformation parameters in real time. For the example of 16QAM, there are only three symbol amplitude levels. Therefore, the processor need only be provided with two relative phase adjustments, two relative amplitude adjustments, and a master gain adjustment in order to provide predistorted symbols to the satellite channel. These controls can be as simple as a set of manual potentiometer knobs or as sophisticated as a computer controlled channel-quality of service (QOS) feedback loop. In practice, the transformation parameters are typically set once for each set of channel conditions and satellite transponder. Once set, no further adjustments are generally required during operation, allowing the digital predistortion modulator of one embodiment to work with existing satellite receivers and m-QAM demodulators. Nevertheless, it would be routine for a skilled practitioner of scientific instrumentation to incorporate a feedback loop into the system that would monitor the communications channel and adjust the predistortion modulator's settings to compensate for changes in the satellite channel. Such changes, for example, would most likely be due to weather-related signal attenuation, but could also be due to aging and degradation of the satellite transponder. Typically, these types of changes happen over the course of several minutes, hours or years, so that it may be a matter of ordinary skill in the art to provide adequately responsive compensation for these types of changes, for example, using a feedback loop.

Referring now to FIGS. 1A and 1B, FIG. 1A is a constellation map 100 comparing a 4-QAM constellation of channel distorted symbols 102 to a 4-QAM constellation of symbols 104, propagated over the channel in accordance with an embodiment of the present invention, and to the original constellation of input symbols 106. FIG. 1B is a constellation map 150 comparing a 16-QAM constellation of channel distorted symbols 152 to a 16-QAM constellation of symbols 154, propagated over the channel in accordance with another embodiment of the present invention, and to the original constellation of input symbols 156.

Symbols are graphed on constellation map 100 according to their quadrature amplitudes, $a_I$ and $a_Q$, which may be measured against in-phase (I) axis 108 and quadrature (Q) axis 110. Similarly symbols are graphed on constellation map 150 according to their quadrature amplitudes, $a_I$ and $a_Q$, which may be measured against in-phase (I) axis 158 and quadrature (Q) axis 160. The phase of each symbol—such as symbol 106a—can be readily observed from constellation map 100 or 150 by noting the angle of the symbol with the I-axis 108 or 158-such as the angle of phase 112 of symbol 106a seen in FIG. 1A. The amplitude of each symbol—such as symbol 106a—can be readily observed from constellation map 100 or 150 by noting the distance from the origin, indicated by circles of constant amplitude—such as circle of amplitude 114 on constellation map 100 or circles of amplitude 164, 166, and 168 on constellation map 150. The larger the circle, the greater the amplitude, or power level, of the symbol.

As seen in FIG. 1A, an original input symbol 106—such as input symbol 106a may be transmitted without predistortion, for example, over a satellite transponder channel, encountering channel distortion to be received as distorted symbol 102a. The phase distortion is the change in phase from phase 112 of transmitted input symbol 106a to phase 116 of received channel distorted symbol 102a. The amplitude distortion is the change in amplitude from input symbol 106a to the amplitude of received channel distorted symbol 102a. Because both symbols 106a and 102a have the same amplitude 114, there is no change in amplitude and thus, no amplitude distortion. For 4-QAM, constellation map 100 shows that all the symbols 106 undergo the same distortion, which is a phase distortion only.

The distortion can be compensated for by predistorting input symbols 106 to predistorted symbols 118 before transmission. For example, input symbol 106a may be processed according to an embodiment to provide predistorted symbol 118a, which may be transmitted, for example, over a satellite transponder channel, encountering channel distortion to be received as symbol 104a. As seen in FIG. 1A, symbols 104 are received with minimal channel distortion and closely approximate or match input symbols 106. Also as seen in FIG. 1A, because all the symbols are transmitted at the same power level (amplitude) the predistortion need only correct for phase.

FIG. 1B shows the situation for higher levels of modulation, in particular, for 16-QAM. For 16-QAM, the amount of distortion and, thus, predistortion needed to compensate, depends on the amplitude. For example, input symbol 156*a*, having small amplitude 168 may undergo a small amount of amplitude and phase distortion to be received as distorted symbol 152*a*. Only a small amount of amplitude and phase predistortion to symbol 178*a* may be required to correct the propagated symbol 154*a* to match symbol 156*a*. Continuing the same example, input symbol 156*b*, having medium amplitude 166 may undergo a medium amount of amplitude and phase distortion to be received as distorted symbol 152*b*. A medium amount of amplitude and phase predistortion to symbol 178*b* may be required to correct the propagated symbol 154*b* to match symbol 156*b*. Continuing the same example further, input symbol 156*c*, having maximum amplitude 164 may undergo a large amount of phase distortion to be received as distorted symbol 152*c*, but may not be amplitude distorted because transmission is at the maximum power level or amplitude. A relatively large amount of phase predistortion to symbol 178*c* may be required to correct the propagated symbol 154*c* to match symbol 156*c*. In general, as illustrated by FIG. 1B, the amount of distortion and, thus, predistortion required, is the same for each symbol 156 at each of amplitudes 164, 166, 168 but may vary nonlinearly as the amplitude is varied from amplitude 164 to amplitude 166 to amplitude 168.

In m-QAM modulation, the RF wave has m possible phase and amplitude combinations that can be encoded onto it; each possible combination is known as a symbol and each symbol contains $\log_2(m)$ binary bits of information. For example, as shown in FIG. 1B, there are 16 input symbols 156 for 16-QAM and each input symbol 156 may contain 4 bits of binary information. An m-QAM symbol is a combination of two quadrature components, represented by a cosine wave and a sine wave, and the relative amplitude of those quadrature components determines the phase and amplitude of the encoded symbol. The symbol train can be represented mathematically by $$V(t) = x_I(t)\cos(2\pi f t) + x_Q(t)\sin(2\pi f t) \quad (1)$$

where f is the RF frequency and $x_I$ and $x_Q$ are integers that change to new values every $T_S$ seconds; $T_S$ is the symbol period. $x_I$ and $x_Q$ can be represented by:

$$x_I(t) = \Sigma a_{I,n}\Theta(t-nT_S, T_S) \text{ where } \Sigma \text{ is over}$$
$$n = -\infty \text{ to } +\infty\; x_Q(t) = \Sigma a_{Q,n}\Theta(t-nT_S, T_S) \text{ where}$$
$$\Sigma \text{ is over } n = -\infty \text{ to } +\infty \quad (2)$$

where the $\Theta$ function is defined as a square pulse and represented as:

$$\Theta(t, T) = 1 \text{ if } |t| \leq T/2 \text{ and } \Theta(t, T) = 0 \text{ otherwise} \quad (3)$$

and the $a_{I,n}$ and the $a_{Q,n}$ are the symbol quadrature amplitudes, and they can have values in the set:

$$\{-(2^I-1), -(2^I-3), \ldots, -1, 1, \ldots, 2^I-3, 2^I-1\} \quad (4)$$

where I=1,2,3,... indicates the depth of the modulation. The 'm' in m-QAM is related to I by $m=2^{2I}$, and the possible values for m are m=4, 16, 64, 256, 1024, etc. The possible symbols available in m-QAM are known as the constellation and they are represented graphically in $\{a_I, a_Q\}$ space as described above with reference to FIGS. 1A and 1B, for example with $a_I$ measured against in-phase (I) axis 158 and $a_Q$ measured against quadrature (Q) axis 160. Each dot on the constellation graphs of FIGS. 1A and 1B represents a symbol, and the RF signal encoded with a symbol will have an amplitude proportional to: $\sqrt{(a_I^2+a_Q^2)}$ and phase equal to: $\arctan(a_I/a_Q)$.

If each symbol is represented by a vector of the form:

$$A_o = (a_{I,o} + j\, a_{Q,o}) = A_o e^{j\theta_o} \quad (5)$$

and the nonlinear distortion is represented by the vector operator:

$$G_d(A) = G_d(A)e^{j\Phi_d(A)} \quad (6)$$

then the nonlinear distortion can be calculated, for example, given an amplifier's gain curves. It is a matter of ordinary skill in the art to calculate the predistortion that will compensate for the distortion of Equation (6). For example, $G_n$ and $\Phi_n$ may be calculated for a symbol A, so that:

$$A = (G_d \cdot G_n)(A)e^{j(\Phi_d + \Phi_n)(A)} \quad (7)$$

Alternatively, gain adjustments $G_n$ and phase adjustments $\Phi_n$ compensating for $G_d(A)$ can be modified during operation until the correct response is achieved for the channel. Input controls may be provided, for example, for the user to adjust the transformation parameters $G_n$ and $\Phi_n$ in real time. Alternatively, an adaptive loop may be provided, for example, that automatically adjusts the transformation parameters $G_n$ and $\Phi_n$ in real time. For example, a test signal may be transmitted and received through a satellite transponder channel or a simulation of the channel, and the error in the received signal may be used to adjust the transformation parameters $G_n$ and $\Phi_n$ until the received signal is correct. The input controls can be, for example, a set of manual potentiometer knobs or a computer controlled channel-QOS feedback loop. In practice, the transformation parameters $G_n$ and $\Phi_n$ may be set once for each set of channel conditions and satellite transponder.

An embodiment of the present invention may be implemented to take advantage of the fact that m-QAM modulation sends symbols in a small number of amplitudes as illustrated, for example, in Table 1. For example, the 16-QAM constellation has three power levels, or amplitudes, amplitude 164, amplitude 166, and amplitude 168. Thus, for 16-QAM, only two relative gain adjustments $G_1$ and $G_2$ may be needed. For example, $G_1$ may be provided to adjust the gain of symbols at amplitude 164 relative to symbols at amplitude 166, and $G_2$ may be provided to adjust the gain of symbols at amplitude 168 relative to symbols at amplitude 166. An overall or master gain adjustment G may also be provided by the predistorter, but the overall gain compensation may be and typically is provided by the modulator and power amplifier. Similarly, for example, only two relative phase adjustments $\Phi_1$ and $\Phi_2$ may be needed. For example, $\Phi_1$ may be provided to adjust the phase of symbols at amplitude 164 relative to the phase of symbols at amplitude 166, and $\Phi_2$ may be provided to adjust the phase of symbols at amplitude 168 relative to the phase of symbols at amplitude 166. An overall or master phase adjustment (may be provided but is generally not needed because the overall phase shift may be compensated by the modulator, power amplifier, or receiver.

Figure 2:
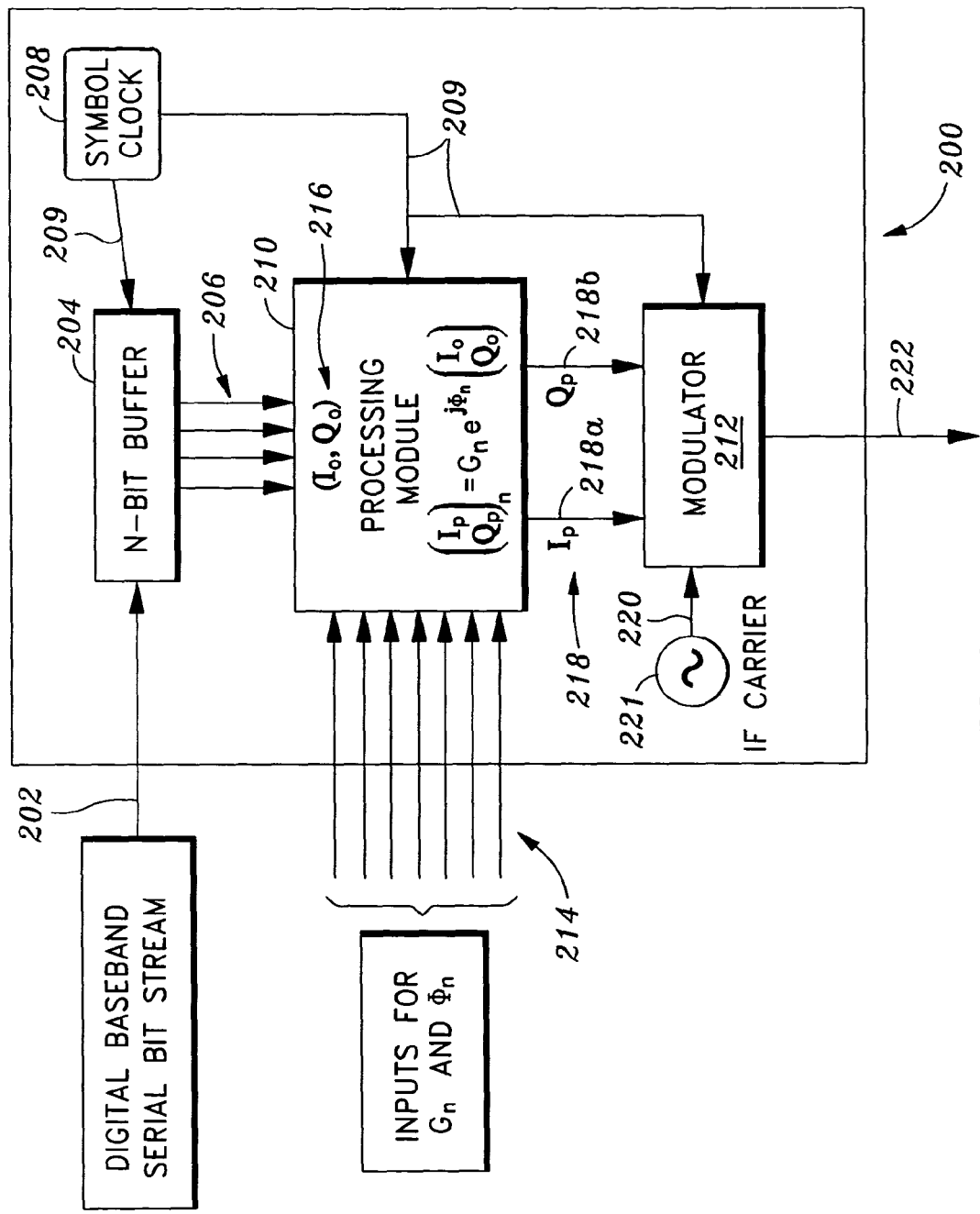
FIG. 2 is a predistortion modulator block diagram, according to one embodiment of the present invention.

FIG. 2 illustrates predistortion modulator system 200 according to one embodiment. A digital baseband serial bit stream 202 may be input to multi-bit (N-bit) buffer 204. For the example of 16-QAM, N=4, and multi-bit buffer 204 may be a 4-bit buffer. A symbol clock 208 may be set to operate at 1/N of the bit rate. For the 16-QAM example, clock 208 may operate at ¼ of the bit rate of serial bit stream 202. Clock 208 may provide a clock signal 209 at 1/N of the bit rate to time the progression of signals through the system components. For example, clock 208 may provide clock signal 209 to buffer 204, processing module 210, and modulator 212.

Digital baseband serial bit stream 202 may be converted into an N-bit parallel bit stream 206. For example, N bits may be read by processing module 210 from buffer 204 at the clock signal, for example, at each transition or edge of clock signal 209. The width N of the parallel bit stream 206 may be determined by the number of bits per symbol in the desired modulation. For the 16-QAM example, modulation requires 4 bits per symbol and therefore N=4.

The processing module 210 may be tuned to compensate for nonlinear distortion, for example, in a satellite transponder. For example, inputs for gain and phase adjustments 214, i.e., the transformation parameters $G_n$ and $\Phi_n$ may be provided, as described above, either from calculation from amplifier gain curves or using a test signal. Gain and phase adjustments 214 may also be modified using an adaptive loop to provide dynamic adaptation of gain and phase adjustments 214 during normal operation. For the example of 16-QAM, only two relative gain adjustments and phase adjustments 214, $G_1$, $G_2$, $\Phi_1$ and $\Phi_2$ may be needed as described above.

The processing module 210 may convert N of the data bits of parallel bit stream 206, for example, the N bits in N-bit buffer 204 when clock signal 209 changes, to an N-bit digital symbol 216. For the example of 16-QAM, N=4 and digital symbol 216 may be an input symbol—such as input symbol 156a—of 16-QAM constellation 150. Processing module 210 may perform a scaling and rotation transformation, for example, as described by Equation (7) using gain adjustments and phase adjustments 214, $G_1$, $G_2$, $\Phi_1$ and $\Phi_2$, on the quadrature components ($I_o$; $Q_o$) of digital symbol 216.

The transformation may depend on ($I_o^2+Q_o^2$), the magnitude of digital symbol 216, where ($I_o$; $Q_o$) are the quadrature components of digital symbol 216. For example, for input symbol 106a of FIG. 1A, $I_o$=1, as measured against in-phase (I) axis 108, and $Q_o$=-1 as measured against quadrature (Q) axis 110. As an input symbol, i.e., the 4 bits of parallel stream 206 representing the input symbol 216, enters the processing module 210, processing module 210 may analyze the bits of input digital symbol 216, determine the quadrature components ($I_o$; $Q_o$) of digital symbol 216, for example, by mapping (as known in the art) the bits of input digital symbol 216 to a particular symbol—such as symbol 156a—of constellation map 150 for the 16-QAM example. Processing module 210 may decide which of the set of pre-set gain and phase adjustments 214 ($G_1$, $G_2$, $\Phi_1$ and $\Phi_2$ for the 16-QAM example) to apply to create the proper predistortion so that received symbol 154a, for example, matches input symbol 156a.

For the 16-QAM example, scaling (using $G_1$, $G_2$) may be performed to adjust the amplitude of the input digital symbol 216, which may be the amplitude 168 of input symbol 156a of constellation map 150, for example, to the amplitude of the predistorted symbol 178a as shown in FIG. 1B. Rotation (using $\Phi_1$, $\Phi_2$) may be performed to adjust the phase of the input digital symbol 216—such as phase 157 of symbol 156a to the phase of the predistorted symbol 178a as shown in FIG. 1B.

Input controls or an adaptive loop may be provided that adjust the transformation parameters, i.e., relative gain and phase adjustments 214, for the 16-QAM example, $G_1$, $G_2$, By and (2, in real time, as described above. For the 16-QAM example, there are only three symbol amplitude levels 164, 166, 168. Thus, the processor 210 need only be provided with two relative phase adjustments 214, such as $\Phi_1$ and $\Phi_2$, and two relative amplitude adjustments 214, such as $G_1$ and $G_2$, and a master gain adjustment in order to provide predistorted symbols 218 to modulator 212 and which may be transmitted, for example, over a satellite channel.

The quadrature components ($I_p$; $Q_p$) 218a, 218b, i.e., quadrature component $I_p$ 218a and quadrature component $Q_p$ 218b, of predistorted symbol 218 may be supplied to a modulator 212. For example, modulator 212 may be implemented using a commercial QPSK modulator chip for pulse shaping, filtering and modulation, and upconversion to an IF carrier 220, which may be provided by local oscillator 221. Because the processing module 210 uses symbol-selective predistortion for quadrature level shifting, a simple QPSK modulator can be used for modulating IF carrier 220 to provide an m-QAM spectrum 222. For the 16-QAM example, m-QAM spectrum 222 may be a 16-QAM spectrum 222. After passing through the satellite channel, the m-QAM spectrum 222 may be received with a minimum of channel distortion, and can be demodulated using commercial satellite receivers and m-QAM demodulators.

Figure 3:
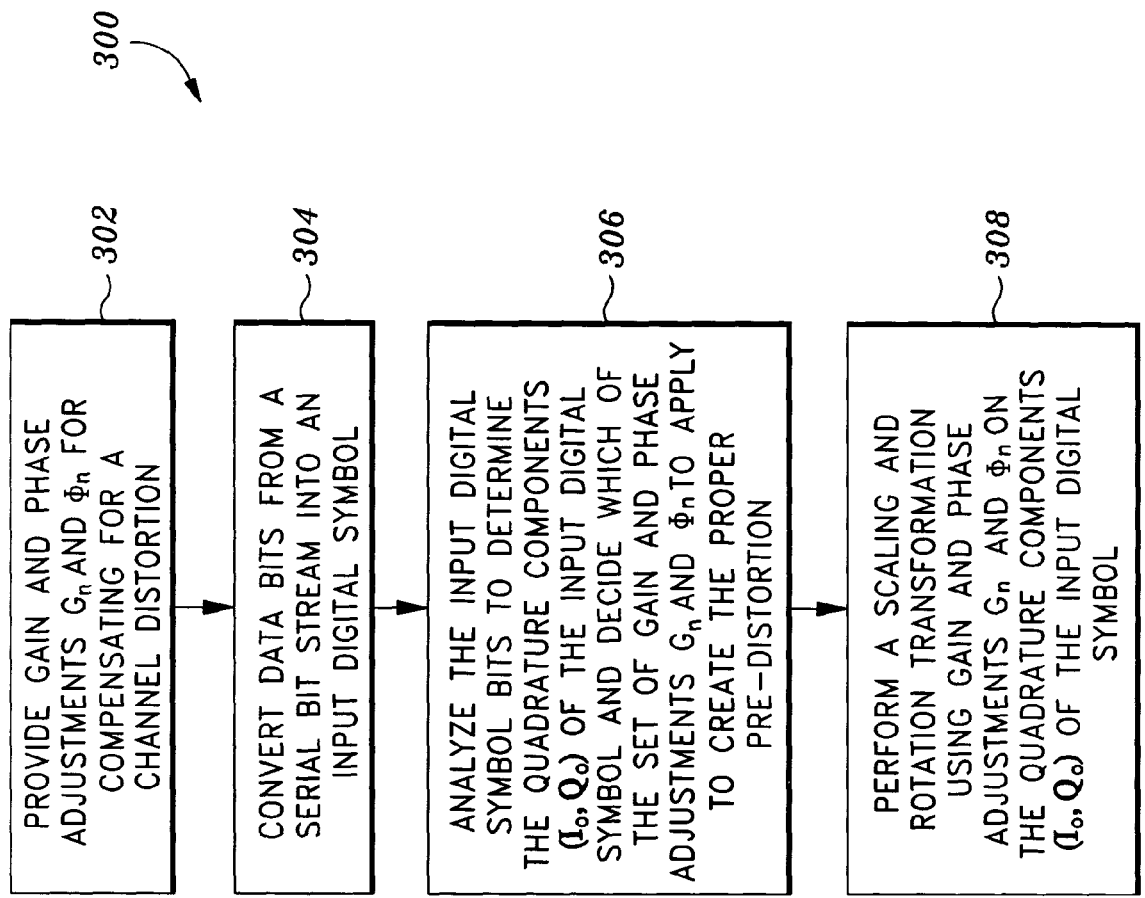
FIG. 3 is a flow chart illustrating a method for digital predistortion of digitally modulated signals, in accordance with an embodiment of the present invention.

Referring now to FIG. 3, an exemplary embodiment of a method 300 for digital predistortion of an RF signal is illustrated by a flowchart. The exemplary method 300 may include steps 302, 304, 306, 308, 310, 312, 314, and 316, which delineate method 300 for purposes of illustration according to one embodiment. Method 300 is illustrated with reference to FIGS. 1 and 2.

Method 300 may begin with a step 302. At step 302, pre-set gain and phase adjustments $G_n$ and $\Phi_n$ may be provided for compensating for a channel distortion. For example, the channel characteristics may be analyzed by the operator of the communications system to determine the values for the G's and ϕ's. Alternatively, the process of determining the values for the G's and ϕ's may be automated, for example, by providing an adaptive loop in the system. For the 16-QAM example, input controls or an adaptive loop may be provided that modify, in real time, the relative gain and phase adjustments 214, for example, transformation parameters $G_1$, $G_2$, $\Phi_1$ and $\Phi_2$, as described above. Gain and phase adjustments $G_n$ and $\Phi_n$ may also be calculated using appropriate amplifier gain curves, as described above.

Method 300 may continue with a step 304, in which data bits from a serial bit stream are converted into an input digital symbol. For the example of 16-QAM, a digital baseband serial bit stream 202 may be input to a multi-bit buffer 204. For the example of 16-QAM, multi-bit buffer 204 may be a 4-bit buffer. Digital baseband serial data bit stream 202 may be converted into a 4-bit parallel bit stream 206. Each four data bits of the parallel bit stream 206 may be converted to a digital symbol 216. For the example of 16-QAM, digital symbol 216 may be one of 16 possible input symbols—such as input symbol 156a—of 16-QAM constellation map 150, and may have quadrature components ($I_o$; $Q_o$).

Method 300 may continue with a step 306. At step 306, the input digital symbol bits may be analyzed to determine the quadrature components ($I_o$; $Q_o$) of the input digital symbol and decide which of the set of pre-set gain and phase adjustments $G_n$ and $\Phi_n$ to apply to create the proper predistortion. For example, processing module 210 may analyze the bits of input digital symbol 216, determine the quadrature components ($I_o$; $Q_o$) of digital symbol 216, and decide which of the set of gain and phase adjustments 214 ($G_1$, $G_2$, $\Phi_1$ and $\Phi_2$ for the 16-QAM example) to apply to create the proper predistortion that may compensate for the channel distortion. (The foregoing assumes that the operator has analyzed the channel characteristics to determine the values for the G's and φ's, or that the process is automated.)

Method 300 may continue with a step 308, in which a scaling and rotation transformation using gain and phase adjustments $G_n$ and $\Phi_n$ may be performed on the quadrature components $(I_o; Q_o)$ of the input digital symbol to produce a predistorted symbol having quadrature components $(I_p; Q_p)$. For example, the transformation may depend on the magnitude $\sqrt{(I_o^2+Q_o^2)}$ of digital symbol 216, denoted $A_o$. The transformation may be applied to quadrature components $(I_o; Q_o)$ of digital symbol 216 to provide quadrature components 218a, 218b $(I_p; Q_p)$ of predistorted symbol 218, denoted $A_p$, according to the following equations:

$$A_p = G_n(A_o)e^{j(\Phi_n(A_o))} \quad (8)$$

$$\sqrt{(I_p^2+Q_p^2)} = G_n\sqrt{(I_o^2+Q_o^2)} \quad (9)$$

$$\arctan(I_p/Q_p) = \Phi_n + \arctan(I_o/Q_o) \quad (10)$$

For the 16-QAM example, $G_1$, $G_2$, $\Phi_1$ and $\Phi_2$ may be sufficient so that n=1 or n=2.

In practice, the gain and phase adjustments 214 may be provided in the form of a linear transformation so that a matrix multiplication may be used to efficiently transform $(I_o; Q_o)$ to $(I_p; Q_p)$. Step 308 may also include modulating an IF or RF carrier, such as IF carrier 220, by the quadrature components 218a, 218b, i.e., $(I_p; Q_p)$, of predistorted symbol 218.

It should be understood, of course, that the foregoing relates to preferred embodiments of the invention and that modifications may be made without departing from the spirit and scope of the invention as set forth in the following claims.

I claim:

1. A device for predistorting a digital symbol, comprising:
    a multi-bit buffer connected to an input serial bit stream and providing an input parallel bit stream; and
    a processing module connected to said input parallel bit stream, wherein said processing module:
    converts data bits of said input parallel bit stream into an input digital symbol;
    applies a gain adjustment and a phase adjustment to said input digital symbol to produce a predistorted symbol; and
    outputs quadrature components of said predistorted symbol.

2. The device of claim 1, further comprising:
    a clock that provides a clock signal to said multi-bit buffer, wherein:
    said processing module reads said multi-bit buffer at said clock signal to convert data bits of said input parallel bit stream into said input digital symbol.

3. The device of claim 1, wherein said processing module analyzes said data bits of said input parallel bit stream and determines the quadrature components $(I_o; Q_o)$ of said input digital symbol.

4. The device of claim 1, wherein said processing module applies said gain adjustment and said phase adjustment to said input digital symbol to produce a predistorted symbol having a proper predistortion so that a received symbol matches said input digital symbol.

5. The device of claim 1, wherein said processing module decides which of a set of pre-set gain and phase adjustments to apply depending on a magnitude of said input digital symbol.

6. The device of claim 1, wherein said processing module applies said gain adjustment G, and said phase adjustment 4n to said input digital symbol A, to produce a predistorted symbol $A_p$ according to:

$$A_p = G_n(A_o)e^{j(\Phi_n(A_o))}.$$

7. The device of claim 1, further comprising:
    a modulator wherein said processing module outputs said quadrature components of said predistorted symbol to said modulator and said modulator modulates an IF carrier by said quadrature components of said predistorted symbol.

8. A device for predistorting a digital symbol for modulating an RF signal, comprising:
    a multi-bit buffer connected to an input serial bit stream and providing a parallel bit stream from said input serial bit stream;
    a processing module connected to said input parallel bit stream, wherein said processing module:
    converts data bits of said input parallel bit stream into an input digital symbol;
    inputs a set of gain and phase adjustments that compensate for a channel distortion;
    decides which of said set of gain and phase adjustments to apply depending on a magnitude of said input digital symbol;
    applies a gain adjustment and a phase adjustment from said set of gain and phase adjustments to said input digital symbol to produce a predistorted symbol; and
    outputs quadrature components of said predistorted symbol.

9. The device of claim 8, further comprising:
    a clock that provides a clock signal to said multi-bit buffer, wherein:
    said multi-bit buffer is an N-bit buffer and said clock operates at 1/N of the bit rate of said input serial bit stream; and
    said processing module reads said multi-bit buffer at said clock signal to convert data bits of said input serial bit stream into said input digital symbol having width N.

10. The device of claim 8, wherein said processing module analyzes said data bits of said input parallel bit stream and determines the quadrature components $(I_o; Q_o)$ of said input digital symbol by mapping said data bits to an input symbol of a constellation map.

11. The device of claim 8, wherein said processing module applies said gain adjustment $G_n$ and said phase adjustment $\Phi_n$ to the quadrature components $(I_o; Q_o)$ of said input digital symbol to produce a predistorted symbol having quadrature components $(I_p; Q_p)$ wherein:

$$\sqrt{(I_p^2+Q_p^2)} = G_n\sqrt{(I_o^2+Q_o^2)}$$

and $$\arctan(I_p/Q_p) = \Phi_n + \arctan(I_o/Q_o).$$

12. The device of claim 8, wherein said set of gain adjustments and phase adjustments that compensate for a channel distortion are calculated from amplifier gain curves to provide a proper predistortion so that a received symbol matches said input digital symbol.

13. The device of claim 8, wherein said set of gain adjustments and phase adjustments that compensate for a channel distortion are modified in real time using an adaptive loop to provide a proper predistortion so that a received symbol matches said input digital symbol.

14. The device of claim 8, further comprising:
a QPSK modulator wherein said predistorted symbol has quadrature components ($I_p$; $Q_p$) and said processing module outputs said quadrature components ($I_p$; $Q_p$) to said QPSK modulator and said QPSK modulator modulates an IF carrier by said quadrature components ($I_p$; $Q_p$).

15. A system for digitally predistorting and modulating an RF signal, comprising:
a multi-bit buffer connected to an input serial bit stream and providing a parallel bit stream from said input serial bit stream;
a processing module connected to said input parallel bit stream, wherein said processing module:
analyzes data bits of said input parallel bit stream and determines quadrature components ($I_o$; $Q_o$) of an input digital symbol by mapping said data bits to an input symbol of a constellation map;
inputs a set of gain adjustments and phase adjustments that compensate for a channel distortion;
decides which of said set of gain and phase adjustments to apply depending on a magnitude $\sqrt{I_o^2+Q_o^2}$ of said input digital symbol;
applies a gain adjustment and a phase adjustment from said set of gain and phase adjustments to said input digital symbol to produce a predistorted symbol; and
outputs quadrature components ($I_p$; $Q_p$) of said predistorted symbol; and
a quadrature modulator wherein said processing module outputs said quadrature components ($I_p$; $Q_p$) to said quadrature modulator and said quadrature modulator modulates an IF carrier by said quadrature components ($I_p$; $Q_p$).

16. The system of claim 15, further comprising:
a clock that provides a clock signal to said multi-bit buffer, wherein:
said multi-bit buffer is an N-bit buffer and said clock operates at 1/N of the bit rate of said input serial bit stream, wherein said constellation map has m symbols and N=$\log_2(m)$; and
said processing module reads said multi-bit buffer at said clock signal to convert data bits of said input parallel bit stream into said input digital symbol having width N so that said input digital symbol is an N-bit digital symbol.

17. The system of claim 15, wherein said processing module applies said gain adjustment $G_n$ and said phase adjustment $\Phi_n$ to the quadrature components ($I_o$; $Q_o$) of said input digital symbol $A_o$ to produce a predistorted symbol $A_p$ having quadrature components ($I_p$; $Q_p$) wherein:

$$\sqrt{I_p^2+Q_p^2}=G_n\sqrt{I_o^2+Q_o^2};$$

$$\arctan(I_p/Q_p)=\Phi_n+\arctan(I_o/Q_o);$$

and $$A_p=G_n(A_o)e^{j(\Phi n(A_o))}.$$

18. The system of claim 15, wherein said set of gain adjustments and phase adjustments are provided in the form of a linear transformation so that a matrix multiplication is used to transform ($I_o$; $Q_o$) to ($I_p$; $Q_p$).

19. The system of claim 15, wherein said set of gain adjustments and phase adjustments that compensate for a channel distortion are calculated from amplifier gain curves to provide a proper predistortion so that a received symbol A matches said input digital symbol $A_o$ according to:

$$A=(G_d \cdot G_n)(A_o)e^{j((\Phi_d+\Phi_n)(A_o))}.$$

20. The system of claim 15, wherein said set of gain adjustments and phase adjustments that compensate for a channel distortion are modified in real time using an adaptive loop to provide a proper predistortion so that a received symbol matches said input digital symbol $A_o$ according to:

$$A=(G_d \cdot G_n)(A_o)e^{j((\Phi_d+\Phi_n)(A_o))}.$$

21. The system of claim 15, further comprising:
a local oscillator, wherein:
said quadrature modulator is a QPSK modulator;
said local oscillator provides an IF carrier to said QPSK modulator;
said processing module outputs said quadrature components ($I_p$; $Q_p$) to said QPSK modulator; and
said QPSK modulator modulates said IF carrier by said quadrature components ($I_p$; $Q_p$) and outputs an m-QAM spectrum.

22. A satellite digital communications system, comprising:
a multi-bit buffer connected to an input serial bit stream and providing a parallel bit stream from said input serial bit stream;
a clock that provides a clock signal to said multi-bit buffer, wherein said multi-bit buffer is an N-bit buffer and said clock operates at 1/N of the bit rate of said input serial bit stream, wherein said multi-bit buffer is read at a transition of said clock signal to convert said input serial bit stream to said input parallel bit stream having width N so that an input digital symbol $A_o$ of a constellation map is represented by N bits of said input serial bit stream; and wherein said constellation map has m symbols and N=$\log_2(m)$;
a processing module connected to said input parallel bit stream, wherein said processing module:
analyzes data bits of said input parallel bit stream and determines quadrature components ($I_o$; $Q_o$) of said input digital symbol $A_o$ by mapping said data bits to an input symbol of a constellation map;
inputs a set of gain adjustments and phase adjustments that compensate for a channel distortion, wherein said set of gain adjustments and phase adjustments are provided in the form of a linear transformation so that a matrix multiplication is used to transform quadrature components ($I_o$; $Q_o$) to quadrature components ($I_p$; $Q_p$) of a predistorted symbol $A_p$;
decides which of said set of gain and phase adjustments to apply depending on a magnitude $\sqrt{I_o^2+Q_o^2}$ of said input digital symbol;
applies a gain adjustment $G_n$ and a phase adjustment $\Phi_n$ from said set of gain and phase adjustments to said input digital symbol to produce a predistorted symbol; and
applies said gain adjustment $G_n$ and said phase adjustment $\Phi_n$ from said set of gain and phase adjustments to said input digital symbol $A_o$ to produce said predistorted symbol $A_p$ according to:

$$\sqrt{I_p^2+Q_p^2}=G_n\sqrt{I_o^2+Q_o^2};$$

$$\arctan(I_p/Q_p)=\Phi_n+\arctan(I_o/Q_o);$$

and $$A_p=G_n(A_o)e^{j(\Phi n(Ao))};$$

and
outputs quadrature components ($I_p$; $Q_p$) of said predistorted symbol.

23. The system of claim 22, further comprising:
a quadrature modulator wherein said processing module outputs said quadrature components ($I_p$; $Q_p$) to said quadrature modulator; and
a local oscillator, wherein:
said local oscillator provides an IF carrier to said quadrature modulator; and
said quadrature modulator modulates said IF carrier by said quadrature components ($I_p$; $Q_p$) and outputs an m-QAM spectrum.

24. A method for digitally predistorting a digital signal, comprising:
receiving a serial bit stream;
converting data bits from said serial bit stream into an N-bit parallel bit stream
converting N of the data bits of said N-bit parallel bit stream into an input digital symbol
analyzing bits of the input digital symbol to determine the quadrature components ($I_o$; $Q_o$) of the input digital symbol;
deciding which of a set of gain and phase adjustments $G_n$ and $\Phi_n$ to apply to said input digital symbol;
performing a scaling and rotation transformation using gain and phase adjustments $G_n$ and $\Phi_n$ on the quadrature components ($I_o$; $Q_o$) of the input digital symbol; and
providing quadrature components ($I_p$; $Q_p$) for a predistorted symbol.

25. The method of claim 24 further comprising a step of:
providing a said set of gain and phase adjustments $G_n$ and $\Phi_n$ calculated from amplifier gain curves for compensating for a channel distortion.

26. The method of claim 24 further comprising a step of:
providing a said set of gain and phase adjustments $G_n$ and $\Phi_n$ modified in real time using an adaptive loop for compensating for a channel distortion.

27. The method of claim 24 further comprising a step of:
providing a said set of gain and phase adjustments $G_n$ and $\Phi_n$ in the form of a linear transformation so that a matrix multiplication is used to transform ($I_o$; $Q_o$) to ($I_p$; $Q_p$).

28. The method of claim 24 further comprising a step of:
modulating an RF carrier by said predistorted symbol having quadrature components ($I_p$; $Q_p$).

* * * * *